United States Patent [19]

Remson

[11] Patent Number: 5,144,287
[45] Date of Patent: Sep. 1, 1992

[54] CURRENT LEVEL SENSING CIRCUIT FOR USE WITH GYRATOR CIRCUITRY

[75] Inventor: Joseph D. Remson, San Jose, Calif.

[73] Assignee: ROLM Systems, Santa Clara, Calif.

[21] Appl. No.: 635,049

[22] Filed: Dec. 28, 1990

[51] Int. Cl.[5] .............................................. G08B 21/00
[52] U.S. Cl. .................................... 340/664; 340/635; 333/215
[58] Field of Search ................ 340/664, 635; 307/355, 307/362; 333/215; 379/379

[56] References Cited

U.S. PATENT DOCUMENTS 4,565,962  1/1986  Nagano .......................... 333/215 X
4,926,462  5/1990  Ladd et al. ............................ 379/67

Primary Examiner—Jin F. Ng
Assistant Examiner—Jeffery A. Hofsass

[57] ABSTRACT

In a current level sensing circuit employing a gyrator to control an opto-isolator, a coupling circuit having an input impedance of a magnitude sufficiently higher than the output impedance of the gyrator that it does not substantially load the gyrator is employed to couple the gyrator output to the opto-isolator. In one embodiment, a differential amplifier receives the gyrator output at a first input which is associated with an output that is coupled to the isolator and a predetermined reference voltage supply is applied to a second input of the differential amplifier. A current sink is connected in a common load path portion of the differential amplifier and is otherwise connected to implement differential amplifier current limiting at a level which assures damage-free operation of the isolator as well as insensitivity to low amplitude electrical disturbances applied to the gyrator. Circuitry for unbalancing the amplifier operation can be used to provide an hysteresis effect in the current transfer function of the amplifier.

22 Claims, 2 Drawing Sheets

CURRENT LEVEL SENSING CIRCUIT FOR USE WITH GYRATOR CIRCUITRY

FIELD OF THE INVENTION

This invention relates to a sensing circuit for sensing the level of electric current in an other circuit, and, more particularly, to a sensing circuit which utilizes a gyrator.

BACKGROUND OF THE INVENTION

The use of gyrators to simulate inductance in integrated circuits is well known. One application of gyrator circuits is in a line interface circuit between a telephone system user station and a telephone line (often called a loop circuit or a two wire circuit) extending to a local telephone system switch, such as a private automatic branch exchange (PABX). The gyrator develops the necessary complex impedance (i.e., inductance, capacitance, resistance) to match the two wire circuit impedance and to respond to application and removal of current from the PABX office battery to the two wire circuit to actuate a binary state indicator such as an opto-isolator. The indicator provides a two wire circuit status signal to the user's station equipment. That equipment may take different forms, and one is, e.g., a computer adapted in a known manner as a voice messaging system (VMS) (i.e., for operation in a telephone message service, or a so-called "voice mail" service). In such service, the user's equipment operates like a highly sophisticated answering machine. Additional background information on voice messaging systems is available in many publications, e.g., U.S. Pat. No. 4,926,462.

In some gyrator applications there is such a low impedance coupling between the gyrator and the opto-isolator that the coupling circuit loads the gyrator and distorts its impedance matching function. In addition, the signaling function is subject to erroneous operation due to effects of aging and temperature changes on the circuit components involved. The result is false operation of the opto-isolator when, e.g., either the two wire circuit current is too low to indicate a true two wire circuit connection or current ring out occurs when the PABX releases a two wire circuit at the end of a call. A false signal ("Falsing") due to ring out is especially troublesome because it disrupts a normal "wink off" function for disconnect in a way which forces an overall longer PABX/VMS system time out procedure to be used for disconnect. When the longer procedure is used, the PABX and VMS facilities are tied up for an undesirably long time which can result in blocking if it occurs on very many of the lines served. PABX systems seldom have any additional disconnect capability once a wink off function has been initiated. If user station equipment does not recognize the wink off and opens a relay contact to appear to be "on hook" to the PABX, the line remains in a "busy" state to the PABX and unusable until some other type of intervention takes place, i.e., human or system reset.

SUMMARY OF THE INVENTION

The foregoing two wire circuit current sensing difficulties are reduced by providing a high input impedance coupling means for connection to the output of a gyrator. The coupling means has an input impedance sufficiently higher than the output impedance of the gyrator such that it does not load down the output of the gyrator. The coupling means produces a binary output signal having a first level in response to first output signals of the gyrator representing two wire circuit electric current below a predetermined level and having a second level in response to second output signals from the gyrator representing two wire circuit current at least equal to the predetermined level.

In one embodiment, the coupling circuit is a differential amplifier. Referencing circuit elements are provided in cooperation with the amplifier to maintain binary state indicator operation relatively reliably at predetermined two wire circuit current threshold values.

View from another aspect, the present invention is directed to a current sensing circuit. The current sensing circuit comprises a gyrator having an input and an output and a differential amplifier. The differential amplifier has a first input coupled to the output of the gyrator, has a second input which is connectable to a reference voltage, and has an output which is coupled to a current sensor circuit output. The gyrator is adapted during operation thereof to generate at the output thereof first and second different voltage levels, the first voltage level being generated when a signal representative of a current level below a predetermined level is applied to the input of the gyrator, and the second voltage level being generated when a signal representative of a current level at or above the predetermined level is applied to the input of the gyrator. The reference voltage is at a level which in-between the first and second voltage levels.

BRIEF DESCRIPTION OF THE DRAWING

A more complete understanding of the invention and its various features and advantages may be obtained from a consideration of the following detailed description and the appended claims in connection with the attached drawing in which:

DETAILED DESCRIPTION

Figure 1:
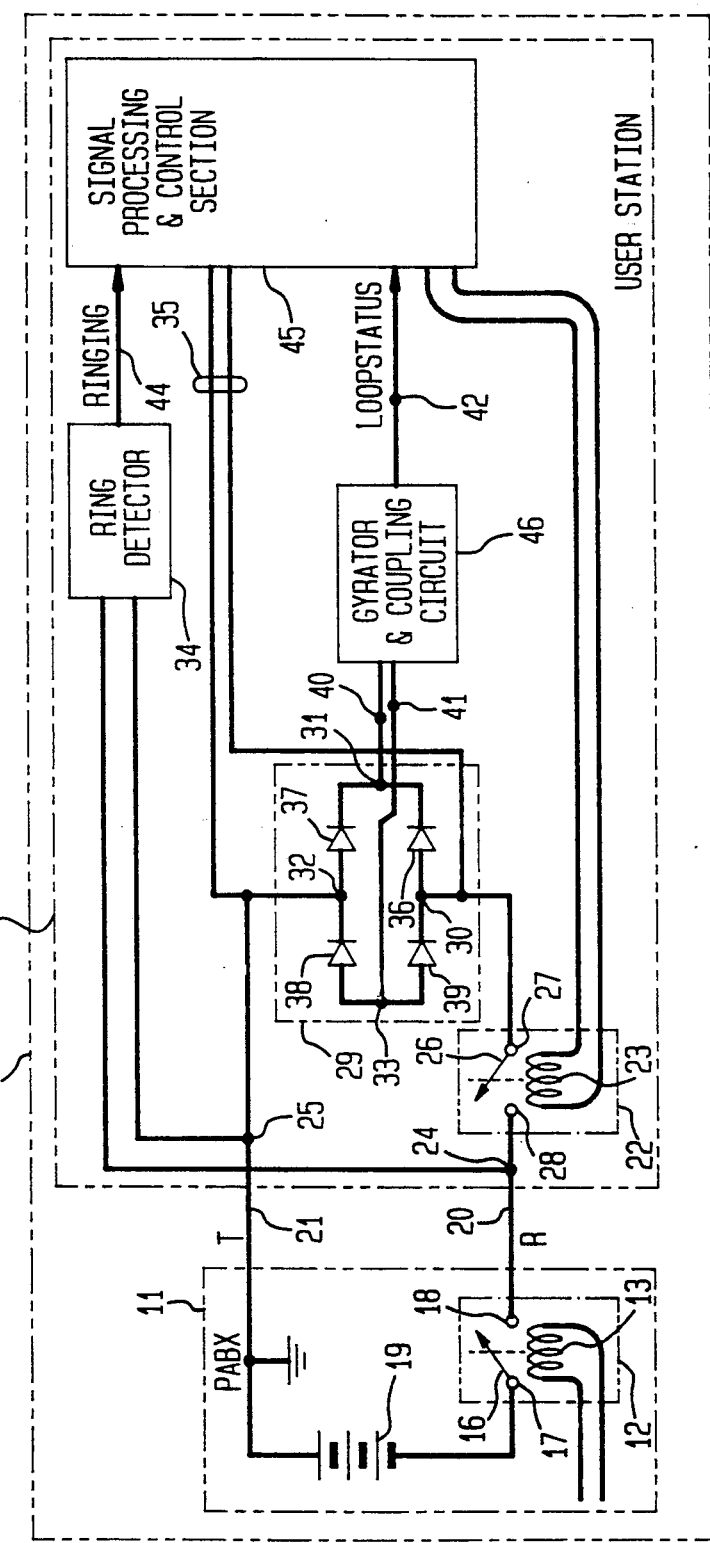
FIG. 1 is a simplified block and line diagram of a relevant portion of a telephone system utilizing the invention.

FIG. 1 depicts a one-line portion of a telephone communication system 10 (shown within a dashed line rectangle). This system portion is described initially in order that the reader may more readily understand the signaling problems encountered and the solution represented by the present invention.

Included in the system 10 is a PABX 11 (shown within a dashed line rectangle). Since PABX systems are well known in the art and their details comprise no part of the present invention, only parts of PABX 11 which facilitate an understanding of the invention are specifically shown. Those parts include a relay 12 (shown within a dashed line rectangle) which includes an operating coil 13 and an armature 16 actuatable for opening and closing circuit connection between terminals 17 and 18. PABX 11 also includes a battery 19 and a user line circuit (i.e., a two wire circuit) including a ring lead 20 (also otherwise designated R) and a tip lead 21 (also otherwise designated T).

Several coupling elements are provided to interface the two wire circuit of leads 20 and 21 to a signal processing and control section 45 (also denoted as section 45 or control section 45) of a user station 47 (shown within a dashed line rectangle). Those elements include a line seizure relay 22 (shown in a dashed line rectangle) having an operating coil 23, an armature 26, and terminals 27 and 28. A full wave rectifier diode bridge 29 (shown within a dashed line rectangle) is included with its terminals 30, 31, 32, and 33 and its diodes 36, 37, 38, and 39. Coupling nodes 24, 25, 40, and 41, a ring detector 34, a voice path circuit (essentially an extension of tip and ring leads 21 and 20) 35, a gyrator and coupling circuit 46, and a node 42 are also included. Section 45 schematically represents hardware and system software for a voice messaging system station such as station 47.

Consider now the interconnections of the elements of FIG. 1. Within relay 12, coil 13 is connected to control circuits (not shown) within the PABX, terminal 17 is connected to a negative terminal of battery 19, terminal 18 is connected via ring lead 20 to terminal 28 of relay 22. A positive terminal of battery 19 and tip lead 21 are connected to ground, and tip lead 21 is in turn connected to terminal 32 of bridge 29. Nodes 24 and 25 (in the ring and tip leads 20 and 21, respectively) are connected to inputs of the ring detector 34. A RINGING output lead 44 from the ring detector 34 is connected to an input of the signal processing and control section 45. Coil 23 of relay 22 has both of its ends connected to signal processing and control section 45. Terminals 30 and 32 of bridge 29 are also connected by way of the voice circuit 35 to the control section 45. Terminal 27 is connected to armature 26 and to terminal 30 of bridge 29.

Within bridge 29, diode 39, terminal 30, and diode 36 are connected in series in the order named between terminals 33 and 31; and those diodes are both poled for forward conduction in that series connection from terminal 3 toward terminal 31. Diode 38, terminal 32, and diode 37 are similarly connected in series between terminals 33 and 31. Terminals 31 and 33 are further connected via nodes 40 and 41 to inputs of the gyrator and coupling circuit 46 (also denoted as circuit 46). The circuit 46 is further connected via a LOOPSTATUS lead, including a node 42, to the control section 45.

Operation of the illustrated portion of system 10 initially includes a quiescent state in which relay 12 is closed, and line seizure relay 22 is open so there is no two wire circuit current (other than leakage current), and there is no call connection. Bridge 29 is included to indicate that circuit 46 operates equally well if the tip and ring leads 21 and 20 are reversed.

When a call is initiated from a remote station (not shown) via PABX 11, the signal on RINGING lead 44 goes low (true); and control section 45 energizes coil 23 to close armature 26 between terminals 27 and 28. Closure of relay 22 enables two wire circuit current to flow through leads 20 and 21, bridge 29, node 40, gyrator and coupling circuit 46, and node 41 back to the bridge 29. The two wire circuit, including leads 20 and 21 and their extensions through bridge 29, is monitored by the gyrator and coupling circuit 46 for current flow. When circuit 46 detects sufficient current to indicate a proper two wire circuit connection, it sends a true LOOP-STATUS signal to control section 45 via node 42. Control section 45 responds to the LOOPSTATUS signal by playing out pre-recorded prompts and/or messages on the two wire circuit via the voice path 35 and PABX 11 to the user who initiated the call.

The term "proper two wire circuit" means that the available current is adequate for communication, as distinguished from a two wire circuit in which there may be only lower level current available (i.e., due to circuit impairments) which is insufficient for reliable communication. A current equal to or greater than 20 milliamperes (ma) is usually considered to indicate a proper two wire circuit, and it is the value so used herein for purposes of illustration.

To terminate a call connection in FIG. 1, the PABX 11 sends a wink off to the user station 47 by briefly opening its relay 12 for a specific period of time (normally 300 milliseconds). The user station 47 replies, as further described below, with an on hook signal to the PABX 11 by opening relay 22 and leaving it open. Assume for purposes of illustration that the remote party goes on-hook first. The PABX 11 system detects that change of state and performs a wink off procedure. In the wink off procedure, the PABX briefly opens its relay 12 to halt the flow of two wire circuit current to the station 47. That loss of two wire circuit current is detected in gyrator and coupling circuit 46 and communicated via node 42 to the control section 45. The control section 45 opens relay 22, after waiting a predetermined period of time less than the wink off period, to signal an on-hook state.

A call is initiated by user station 47 when control section 45 closes relay 22. Gyrator and coupling circuit 46 detects sufficient two wire circuit current to indicate a proper circuit for communication and sends a true LOOPSTATUS signal to section 45. Then the control section 45 process signals received from the PABX on the tip lead 21, ring lead 20, and voice path 35 until dial tone is recognized. Once dial tone is recognized, the user equipment outpulses called party address digits to the PABX via voice path 35, and the call then proceeds as usual.

Figure 2:
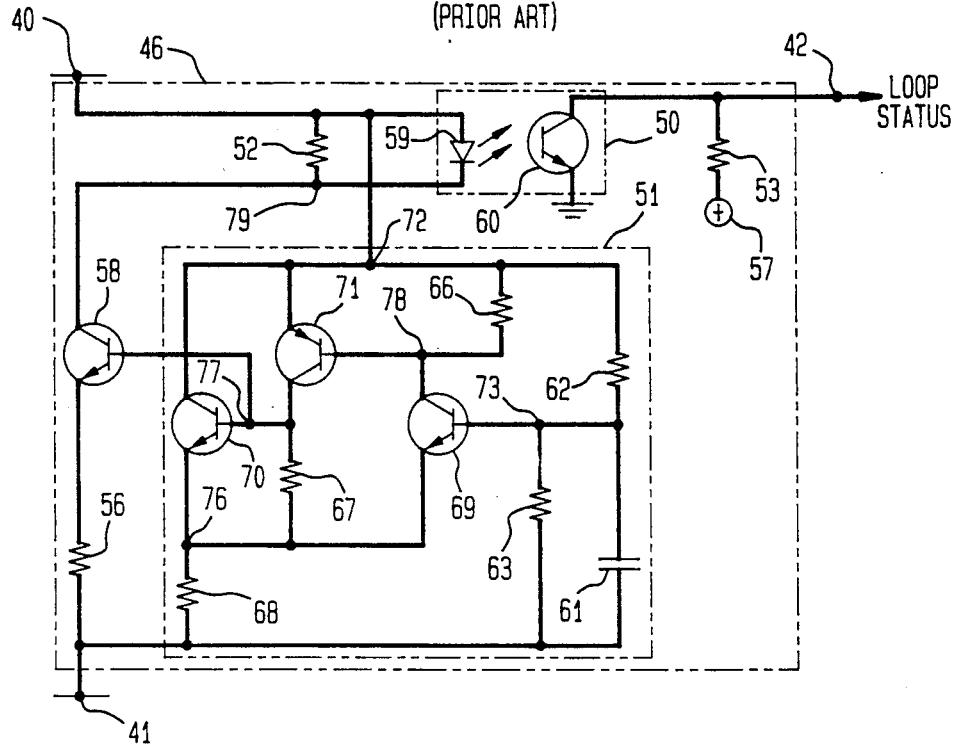
FIG. 2 is a schematic diagram of a prior art gyrator and coupling circuit employed in the system of FIG. 1.

A prior art form of the gyrator and coupling circuit 46 (also denoted as circuit 46) is shown within a dashed line rectangle in FIG. 2. Elements of the circuit are here listed, with illustrative resistances and capacitance indicated in parentheses. Circuit 46 includes an opto-isolator 50 (shown within a dashed line rectangle), a gyrator 51 (shown within a dashed line rectangle) resistors 52 (8.2 kilohms [K]), 53 (200K), and 56 (100 ohms), a circuit node 79, a positive voltage supply 57 (+5 volts), and an n-p-n transistor 58. Supply 57 is schematically represented by symbol including a circled polarity sign representing a source having one terminal of that polarity connected to the circuit point of the symbol location and having a terminal of opposite polarity connected to ground. Isolator 50 includes a light emitting diode (LED) 59 and a photodetecting (light detecting) n-p-n transistor 60 having a photo-sensitive base. Gyrator 51 is one of a number of gyrator circuits known in the art and includes a capacitor 61 (1 microfarad), resistors 62 (124K), 63 (40.2K), 66 (4.7K), 67 (88 ohms), and 68 (10 ohms), n-p-n transistors 69 and 70, and a p-n-p transistor 71. Circuit nodes 72, 73, 76, 77, and 78 are also included.

Considering the connections in the gyrator and coupling circuit 46 in FIG. 2, node 40 is connected to a first end of resistor 52, to the anode of LED 59, and to the node 72 in gyrator 51. The cathode of LED 59 and a second end of resistor 52 are connected to node 79, which is in turn connected to the collector of transistor 58. The emitter of transistor 58 is connected through resistor 56 to node 41. Transistor 60 has its collector connected to node 42 and its emitter connected to ground. Resistor 53 is connected between supply 57 and node 42. Within gyrator 51, resistor 62 and capacitor 61 are connected in series between nodes 72 and 41, and the node 73 between them in that connection is connected to the base of transistor 69. Resistor 63 is connected between nodes 73 and 41. Resistor 66 is connected between nodes 72 and 78, and node 78 is also connected to the collector of transistor 69 and to the base of transistor 71. Node 72 is further connected to the emitter of transistor 71 and to the collector of transistor 70. The collector of transistor 71 is connected to node 77 which is also connected to the bases of transistors 70 and 58. Resistor 67 is connected between nodes 77 and 76. The emitter of transistor 70 is connected to node 76. The resistor 68 is connected between nodes 76 and 41.

We turn now to operation of circuit 46 and its included circuit 51 in FIG. 2. It is noted at the outset that in the course of normal operation to be described none of the transistors shown is operated in a saturated condition. In the absence of two wire circuit current, the circuit 46 is inactive and all transistors are off (nonconducting). On the closure of relay 22 (see FIG. 1), the gyrator 51 begins to conduct. Capacitor 61 charges, transistor 69 is biased on (to conduct current in its internal collector-emitter path) drawing current through resistor 66 and thereby lowering the voltage of node 78 sufficiently to draw transistor 71 into conduction. The resulting current in resistors 67 and 68 biases transistor 70 into conduction; and, if there is sufficient two wire circuit current available to indicate a proper two wire circuit connection from PABX 11, transistor 58 also is biased into conduction thereby turning on LED 59 to illuminate transistor 60. Transistor 60 is biased on by the emitted light, and the LOOPSTATUS signal goes low (true) to indicate to the control section 45 that the two wire circuit is ready for communication. Resistor 52 has a relatively high resistance compared to LED 59 and is provided to share sufficient current to reduce the likelihood that the LED will be damaged in the event of an excess current surge in the two wire circuit.

After isolator 50 is activated, the gyrator 51 and transistor 58 share the available two wire circuit current. Since resistor 68 is usually about one-tenth the resistance of resistor 56, transistor 70 of the gyrator 51 carries the bulk of the current. Circuit 46 remains in the condition just described as long as two wire circuit current flows.

When two wire circuit current is terminated (e.g., during the aforementioned wink off procedure), the transistors of gyrator 51 are biased off (nonconducting) as are transistor 58 and LED 59. Consequently, transistor 60 also goes nonconducting; and the LOOPSTATUS signal goes high indicating the changed two wire circuit status to control section 45, which should open relay 22.

One problem with the prior art gyrator and coupling circuit 46 of FIG. 2 is the relatively unstable (as to temperature) point (i.e., node 77) to which the base of transistor 58 is attached in the gyrator. Parametric variations in the input impedances (e.g., substantial variations in base-emitter voltage with temperature) of transistors 58 and 70 tend to cause direct current (DC) operating point drift and result in deterioration of the gyrator impedance matching function. That deterioration can cause various unwanted electrical disturbances on the two wire circuit. The aging effect on LED 59, which is usually operated at a relatively low voltage point on its characteristic to provide some assurance that surges will not damage it, causes it to emit less light for a given current as time goes by.

Another problem with the circuit 46 of FIG. 2 is that the temperature and aging effects on, e.g., transistors 58 and 70, with their common base drive connection, can allow the gyrator 51 to activate LED 59 falsely in response to two wire circuit current levels much lower than the desired 20 ma level which indicates a proper two wire circuit connection. As temperature varies, the base to emitter voltage of either or both of transistors 70 and 58 will vary, but not necessarily congruently, and therefore could have a detrimental effect on the other transistor. For example, if transistor 70 should sink more base current than transistor 58, the latter may operate at such a low collector current level that LED 59 will operate only weakly, or possibly not at all.

It has also been found with the circuit 46 in FIG. 2 that it may provide false signals to station 47 in response to the aforementioned wink off procedure. That is, when the PABX initiates wink off by briefly opening the two wire circuit at relay 12 (FIG. 1), there is sometimes a certain amount of ring-out oscillation. Although that oscillation is at a lower amplitude level than the 20 ma level that indicates a proper two wire circuit, it is nevertheless sufficient, when temperature and aging have taken their toll, to cause gyrator 51 to activate opto-isolator 50 to indicate a proper circuit. Consequently, section 45 does not open relay 22. So no off hook indication is forthcoming from station 47. Thus, the wink off interval expires while the two wire circuit still draws current but is not otherwise in use; and the PABX must wait for the completion of a longer time-out procedure or, in some systems, there may be no alternative time-out procedure at all.

Figure 3:
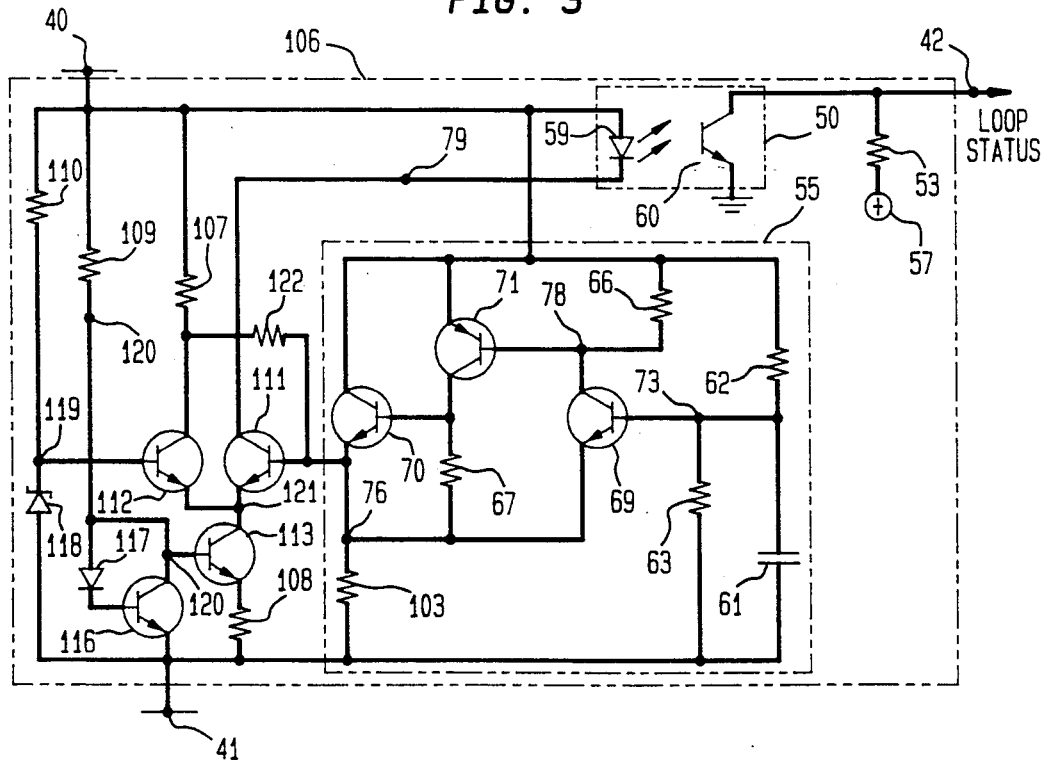
FIG. 3 is a schematic diagram of a gyrator and coupling circuit in accordance with the present invention and useful in the system of FIG. 1.

FIG. 3 shows a gyrator and coupling circuit 106 (also denoted as circuit 106) in accordance with the present invention. The gyrator and coupling circuit 106 is designed to reduce the LOOPSTATUS signaling problems of the types just outlined. Circuit elements in FIG. 3 which are the same as those used in other figures are designated by the same reference characters.

The gyrator and coupling circuit 106 comprises the isolator 50, the resistor 53, the supply 57, and the node 79, which are the same as the corresponding components of gyrator 51 of FIG. 2, and further comprises a gyrator 55 (shown within a dashed line rectangle) which is essentially the same as gyrator 51 of FIG. 2 except that a larger resistor 103 (30 ohms) replaces resistor 68 (10 ohm) between nodes 76 and 41 to realize somewhat more positive voltage at node 76 than is achieved by circuit 46 of FIG. 2. Circuit 106 also comprises resistors 107 (1100 ohms), 108 (140 ohms), 109 (6000 ohms), 110 (6000 ohms), and 122 (5000 ohms), n-p-n transistors 111, 112, 113, and 116, a diode 117, a breakdown (zenor) 118, and circuit nodes 119, 120, and 121. The resistor values are given to illustrate a typical illustrative embodiment.

Gyrator 55 is connected between nodes 40 and 41, i.e., through bridge 29 (see FIG. 1) across the two wire circuit including leads 20 and 21 (see FIG. 1), as described above. The cathode of LED 59 is connected through node 79 to the collector of transistor 111, which has its base connected to node 76 of gyrator 55 and its emitter connected through node 121 to the collector of transistor 113. The emitter of transistor 113 is connected through resistor 108 to node 41, and its base is connected to node 120. Transistor 112 has its collector connected through resistor 107 to node 40 and through resistor 122 to node 76, its base connected to node 119, and its emitter connected to node 121. Connected in series between nodes 40 and 41 are resistor 109, node 120, and the collector and emitter of transistor 116. The diode 117 is connected between node 120 and the base of transistor 116, and it is poled for forward conduction toward that base with its anode and cathode connected to node 120 and to the base of transistor 116, respectively. Also connected in series between nodes 40 and 41 are resistor 110, node 119, and breakdown diode 118. The anode and cathode of diode 118 are connected to nodes 41 and 119, respectively. Diode 118 can be said to be poled for forward conduction from node 41 toward node 119.

Turning now to operation of the gyrator and coupling circuit 106 of FIG. 3, the gyrator 55 operates the same as previously described gyrator 51 of FIG. 2 except that signals developed at node 76 (i.e., between nodes 76 and 41) in response to two wire circuit current variations are somewhat larger in amplitude. The coupling of those signals for controlling LED 59 is modified to shift the operating point of the LED to a higher current level and to provide more stable operational thresholds as described more fully below.

Coupling gyrator output from node 76, at the emitter of transistor 70, essentially removes the effects of temperature and aging on the transistor 70 of FIG. 3 as variables affecting circuit 106 operation. Voltage at node 76, i.e., the drop across resistor 103, is applied to the base of transistor 111, which cooperates with transistor 112 in a differential amplifier circuit including a current sink in their common emitter load. The differential amplifier circuit includes a first output current path through the internal collector-emitter conduction path of transistor 111 and a second output current path through the internal collector-emitter conduction path of transistor 112. Transistor 113 is operated as a current sink in the common load current path. Current typically switches between the first and second output current paths and flows through the common load circuit path.

Node 119 is connected to the base of transistor 112 so that the potential dividing combination of resistor 110 and the diode 118 comprises a reference voltage supply for the differential amplifier. The base of transistor 112 serves as a reference voltage input of the differential amplifier and the base of transistor 111 serves as a signal input of the differential amplifier. The diode 118 and the resistance of resistor 110 are chosen in relation to the anticipated voltage developed between nodes 40 and 41 so that transistor 112 normally conducts nearly the full differential amplifier current in response to two wire circuit current values below the predetermined value indicating a proper two wire circuit connection. Under those conditions, transistor 111 remains essentially non-conducting. When the gyrator 55 output at node 76 has attained a level indicating at least the aforementioned predetermined proper two wire circuit current (e.g., 20 ma), transistor 111 begins to conduct. Nearly all of the differential amplifier current is transferred from transistor 112 to transistor 111. The resulting conduction in LED 59 activates opto-isolator 50 and the LOOPSTATUS signal goes low, providing the true signal to control section 47 to indicate that a proper two wire circuit is available.

The two wire circuit current level at which isolator 50 is actuated is thus relatively rigidly fixed by diode 118 and resistor 110. In addition, the diode 118 is advantageously selected to have a temperature coefficient which is approximately a complement for the temperature coefficient of the base-emitter junctions of transistors 111 and 112. Thus, if temperature effects should cause the characteristics of the transistors to drift in such a way as to tend to allow transistor 111 to be biased on for conduction at a voltage corresponding to a two wire circuit current lower than the predetermined minimum two wire circuit threshold, diode 118 experiences a similar temperature-induced change. That change in diode 118 causes transistor 112 to be biased for greater conduction and thereby increases the voltage developed at node 121 to maintain the proper threshold of operation.

Transistor 113 is operated as a current sink controlled by the potential dividing combination of resistor 109, diode 117, and transistor 116. Resistors 108 and 109, transistors 113 and 116, and diode 117 cooperate to act as a current limiter to limit the maximum current through transistors 111 and 112 and therefore through LED 59. Thus, the LED is protected against damage from excess current. At the same time, the limiting current value is chosen sufficiently high to cause LED 59 to have an operating point both well above a range in which temperature and aging significantly affect light level emitted therefrom and well above anticipated amplitudes of ring-out oscillations that may occur during the wink off procedure. Consequently, when the PABX terminates a connection with the wink off procedure, gyrator 55 responds by turning off transistor 111 and isolator 50. Any following oscillations in line current are unable to maintain conduction in LED 59; the LOOPSTATUS signal remains high (not true), and control section 45 is able to release relay 22 after waiting a predetermined period. So the PABX/VMS facilities are available for other calls, and the threat of possible blocking is substantially reduced.

The aforementioned current limiting function bestows another benefit on the circuit 106. Because of the voltage limiting effects of diode 117 and the base-emitter junction of transistor 116 in the potential divider including resistor 109, the base of transistor 113 is held at a relatively low voltage compared to the voltage between nodes 40 and 41. Consequently transistor 113 has a wide range over which it can successfully keep the voltages across the transistors 111 and 122 (which form a differential pair of emitter coupled transistors) and the related resistor 107 and LED 59, within their normal operating range while the voltage from node 40 to node 41 settles after the closure of relay 22. In the illustrative embodiment the resistance looking into the collector of transistor 113 is in the range of thousands of ohms. Thus, the input impedance presented by the differential amplifier (between the base of transistor 111 and node 41 which is substantially equal to the product of the beta [current gain] of transistor 111 and the collector resistance of transistor 113) to the gyrator 55 output is several orders of magnitude larger than the gyrator output impedance (between nodes 76 and 41). Accordingly, there is no significant loading of the gyrator 55 and no significant distortion of the inductance simulating function of the gyrator 55.

Resistors 107 and 122 are advantageously included in the collector current circuits of transistor 111 for applications where it is desired to have some hysteresis effect so that transistor 111 is turned on in response to a higher base voltage than that at which it is turned off. The values of resistors 107 and 122 are selected so that some additional current (beyond that from transistor 70) flows through resistor 103. As a result, two wire circuit current must exceed the predetermined value of 20 ma which causes the gyrator output (node 76) to equal the voltage at node 121 to cause LOOPSTATUS to come true; and two wire circuit current must drop below 20 ma by a predetermined amount (dependent upon the values of resistors 107 and 122) before the gyrator output (node 76) falls below the voltage at node 121 and biases transistor 111 to a near nonconducting state.

It will be seen that the use of resistors 107 and 122 as described, causes the isolator 50 to be operated crisply. That is, when transistor 111 is turning on, it experiences increasing voltage at node 76 due to both increasing two wire circuit current from transistor 70 and increasing current diverted from transistor 112 through resistor 122 when two wire circuit current is increasing. Similarly, when transistor 111 is being turned off the diverted current is restored to transistor 112 speed up its turn on. Of course, if no hysteresis is needed, resistors 107 and 122 are omitted and the collector of transistor 112 is connected to node 40.

Although the invention has been described in connection with one particular embodiment, other embodiments, applications, and modifications that will be apparent to those skilled in the art are included within the spirit and scope of the invention.

I claim:

1. A current level sensing circuit for sensing attainment of a predetermined electric current level in a two wire circuit, said sensing circuit comprising:
   a gyrator connected in a first path across said two wire circuit and having an output connection;
   coupling means connected to said gyrator output connection, said coupling means producing a binary output signal having a first level in response to first signals in said gyrator output connection representing two wire circuit current below said predetermined electric current level and having a second level in response to second signals in said gyrator output connection representing two wire circuit current at least equal to said predetermined electric current level;
   binary indicating means responsive to the coupling means binary output signals for indicating the level of such output signals;
   said coupling circuit comprising:
      a current source connected in series with said indicating means; and
      means for switching current between a first current path including said current source and connected across said two wire circuit in parallel with said gyrator, and a second current path including said current source and said indicating means connected in series across said two wire circuit in parallel with said gyrator, said coupling means binary output signal appearing in said second current path; and
      means, responsive to said gyrator output, for causing said current switching means to switch a further predetermined current from its first path to its second path to produce said second level binary output signal, and to switch current form its second path back to its first path to produce said first level binary output signal.

2. A current level sensing circuit for sensing attainment of a predetermined electric current level in a two wire circuit, said sensing circuit comprising:
   a gyrator having an input coupled to the two wire circuit and having an output;
   coupling means coupled to the output of the gyrator for producing a binary output signal having a first level in response to first output signals of the gyrator representing two wire circuit current below the predetermined electric current level and having a second level in response to second output signals of the gyrator representing two wire circuit current at least equal to said predetermined electric current level;
   said coupling means having an input impedance of a magnitude sufficiently higher than the impedance of the output of the gyrator such that it does not substantially load the output of the gyrator; and
   the coupling means comprises a differential amplifier having a common load current path, a first output current path, a second output current path, and a reference voltage supply means for generating a reference voltage having a level in-between the voltage levels of the first and second output signals of the gyrator.

3. The current level sensing circuit of claim 2 in which said reference voltage supply means comprises a resistor coupled by a first terminal thereof to the cathode of a breakdown diode and to a reference voltage input of the differential amplifier, and in which the differential amplifier has a signal voltage input coupled to the output of the gyrator.

4. The current level sensing circuit of claim 2 in which said differential amplifier comprises:
   a current sink in the common load current path; and
   means for controlling the current sink.

5. The current level sensing circuit of claim 4 in which said control means comprises a potential divider connected across said two wire circuit and comprising:
   a resistor;
   a transistor having an internal collector-emitter conduction path connected in series with said resistor;
   a diode coupled between a collector and base of the transistor and poled for forward conduction from the collector to the base; and
   means for connecting the collector of the transistor to the current sink.

6. The current level sensing circuit of claim 4 further comprising binary state indicating means coupled in the first output current path and comprising a light emitting diode for generating a binary output signal.

7. The current level sensing circuit of claim 4 which further comprises means for unbalancing current transfer in the differential amplifier to provide an hysteresis effect so that an output signal of said gyrator which is just sufficient to cause transfer of said nearly all current from the common load current path from the second output path to the first output path is substantially greater than an output signal of said gyrator which is just small enough to cause transfer of such current from the first output path to the second output path.

8. The current level sensing circuit of claim 7 in which said unbalancing means comprises:
   resistance means in said second output current path for developing an output voltage greater than the voltage of the second output signals of said gyrator; and cross connecting resistance means connected between said second output current path and the output of the gyrator to provide current flow therebetween.

9. The current level sensing circuit of claim 2 in which said differential amplifier comprises:
first and second transistors each having a base, an emitter, and a collector;
a current sink;
means for connecting the emitters together to one terminal of the current sink;
means for controlling the current sink; and
binary state indicating means coupled to the first output current path for determining conduction therethrough.

10. The current level sensing circuit of claim 9 in which the reference voltage supply means comprises a resistor having a terminal coupled to the cathode of a breakdown diode and to a reference voltage input of the differential amplifier.

11. The current level sensing circuit of claim 10 in which said current sink control means includes a potential divider connected across said two wire circuit and comprising:
a resistor;
a transistor having an internal collector-emitter conduction path connected in series with said resistor;
a diode connected between a collector and base of the transistor and poled for forward conduction from the collector to the base; and
the collector of the transistor being coupled to the current sink.

12. The current level sensing circuit of claim 2 in which the gyrator comprises:
a transistor having a collector and an emitter;
an emitter load resistor;
means for connecting an internal collector-emitter conduction path of said transistor in series with said emitter load resistor across said two wire circuit; and
means, exclusive of said transistor, for connecting a voltage differential across said resistor to a signal input terminal of the differential amplifier.

13. The current level sensing circuit of claim 10 in which the reference voltage supply breakdown diode and the first and second transistors have complementary temperature coefficients such that effects of temperature-induced variations in the characteristics of the transistors are approximately offset by temperature-induced variations in the characteristics of the breakdown diode.

14. A current sensor circuit comprising:
a gyrator having an input and an output;
a differential amplifier having a first input coupled to the output of the gyrator, a having a second input which is connectable to a reference voltage, and having an output which is coupled to a current sensor circuit output;
the gyrator being adapted during operation thereof to generate at the output thereof first and second different voltage levels, the first voltage level being generated when a signal representative of a current level below a predetermined level is applied to the input of the gyrator, and the second voltage level being generated when a signal representative of a current level at or above the predetermined level is applied to the input of the gyrator; and
the reference voltage being at a level which in-between the first and second voltage levels.

15. The current sensor circuit of claim 14 further comprising an optical coupling stage having an input coupled to the output of the differential amplifier and having an output coupled to the output of the circuit.

16. The current sensor circuit of claim 15 wherein:
the optical coupler comprises a light emitting device coupled to the output of the differential amplifier and comprises a light detecting device coupled to the output of the circuit; and
the light emitting device being positioned such that light emitted thereby is incident upon a light sensitive portion of the light detecting device.

17. The current sensor circuit of claim 16 wherein:
the differential amplifier comprises first, second and third n-p-n transistors each having an emitter, a base and a collector;
the emitters of the first and second transistors being coupled to the collector of the third transistor; and
the collector of the first transistor being coupled to the light emitting device.

18. The current sensor circuit of claim 17 wherein:
the light emitting device is an light emitting diode having an anode and a cathode and the light detecting device is a light sensitive fourth n-p-n transistor having a light sensitive base, an emitter and a collector;
the cathode of the light emitting diode is coupled to the collector of the first transistor; and
the collector of the fourth transistor being coupled to the output of the current sensor circuit.

19. A current sensing circuit comprising:
first (T1), second (T2), and third transistors each having an emitter, a base and a collector, T1 and T2 being n-p-n transistors and T3 being a p-np transistor;
first (R1), second (R2), third (R3), fourth (R4), and fifth (R5) resistors each having first and second terminals;
a capacitor (C1) having first and second terminals;
the collector of T2 being coupled to the emitter of T3, to the first terminals of R1 and R3, and to a first input of the circuit;
the first terminals of R2, R5 and C1 being coupled to a second input of the circuit;
the second terminal of R3 being coupled to the base of T3 and to the collector of T1;
the second terminals of R1, R2, and C1 being coupled to the base of T1;
the base of T2 being coupled to the collector of T3 and to the first terminal of R4;
the second terminals of R4 and R5 being coupled to the emitters of T1 and T2;
fourth (T4) and fifth (T5) transistors each having an emitter, a base and a collector, T4 and T5 being n-p-n transistors;
the base of T4 being coupled to the emitter of T2;
the emitters of T4 and T5 being coupled together to a current sink;
the base of T5 serving as a reference voltage terminal; and
the collector of T4 being coupled to an output of the circuit.

20. The current sensing circuit of claim 19 wherein the current sink comprises:

sixth (T6) and seventh (T7) transistors each having an emitter, a base and a collector, T6 and T7 being n-p-n transistors;

sixth (R6), seventh (R7), and eighth (T8) resistors each having first and second terminals;

first (D1) and second (D2) diodes each having an anode and a cathode;

the collector of T6 being coupled to the emitters of T4 and T5;

the emitter of T6 being coupled to the first terminal of R6;

the base of T6 being coupled to the collector of T7, to the anode of D1, and to the first terminal of R7;

the base of T5 being coupled to the cathode of D2 and to the first terminal of R8;

the anode of D2 being coupled to the emitter of T7, to the second terminal of R6, and to the first terminal of R5; and the second terminals of R7 and R8 being coupled to the emitter of T3.

21. The current sensing circuit of claim 20 further comprising:

ninth (R9) and tenth (R10) resistors each having first and second terminals;

the collector of T5 being coupled to the first terminals of R9 and R10;

the second terminal of R10 being coupled to the base of T4 and to the emitter of T2; and the second terminal of R9 being coupled to the emitter of T3.

22. The current sensing circuit of claim 21 further comprising:

a third diode (D3) having an anode and a cathode, T3 being a light emitting diode;

an eighth transistor (T8) having a light sensitive base, and an emitter and a collector, T8 being a light detecting n-p-n transistor;

an eleventh (R11) resistor having first and second terminals;

the anode and cathode of D3 being coupled to the emitter of T3 and to the collector of T4, respectively;

the collector of T8 being coupled to an output of the current sensing circuit and to the first terminal of R11;

a second terminal of R11 serving as a first power supply terminal; and the emitter of T8 serving as a second power supply terminal.

* * * * *